United States Patent [19]

Brewer

[11] 4,133,907

[45] Jan. 9, 1979

[54] HIGH RESOLUTION ELECTRON BEAM RESIST

[75] Inventor: Terry L. Brewer, Plano, Tex.

[73] Assignee: Texas Instruments Incorporated, Dallas, Tex.

[21] Appl. No.: 853,673

[22] Filed: Nov. 21, 1977

Related U.S. Application Data

[63] Continuation of Ser. No. 412,934, Nov. 5, 1973, abandoned.

[51] Int. Cl.² .............................................. B05D 3/06
[52] U.S. Cl. ...................................... 427/43; 96/35.1; 96/36.2; 204/159.14; 204/159.22
[58] Field of Search ................... 427/43; 96/35.1, 36.2; 204/159.14, 159.22

[56] References Cited

U.S. PATENT DOCUMENTS

| | | | |
|---|---|---|---|
| 3,133,825 | 5/1964 | Rubens | 427/44 |
| 3,535,137 | 10/1970 | Haller | 427/43 |
| 3,627,659 | 12/1971 | Marx et al. | 427/44 |
| 3,661,582 | 5/1972 | Broyde | 427/43 |
| 3,681,103 | 8/1972 | Brown | 427/43 |
| 3,703,402 | 11/1972 | Cole | 427/43 |

OTHER PUBLICATIONS

Bargon et al., "IBM Tech. Disc. Bull." vol. 18 No. 8 Jan. 1976, p. 2622.

*Primary Examiner*—John H. Newsome
*Attorney, Agent, or Firm*—James T. Comfort; Gary C. Honeycutt

[57] ABSTRACT

Disclosed is a method of forming patterned electron beam resists from polymers that undergo energy intensity or electron dosage dependent reactions. Upon the introduction of sufficient energy, the polymer generates two reactive species that react with each other. However, with a lower amount of energy, the polymer generates only one reactive species. A thin film of the dosage dependent polymer is applied to a support and is subjected to a programmed electron beam scan. The electron beam irradiates a portion of the polymer film according to the programmed pattern and furnishes enough energy in the path of the beam to cause the polymer to cross link where directly irradiated, thus causing the polymer to become insoluble in certain solvents. The portion of the polymer adjacent the directly irradiated portion is subjected to electrons backscattering from the surface of the support, which electrons are a small percentage of the total beamed at the polymer. This adjacent portion of the polymer does not receive sufficient energy from the back-scattered electrons to effect much degree of cross linking in some cases, and in other cases the polymer may actually degrade. The back-scattered portion of the polymer along with the unirradiated portion of the polymer remains soluble in certain solvents and is removed resulting in the desired pattern of openings.

3 Claims, 3 Drawing Figures

HIGH RESOLUTION ELECTRON BEAM RESIST

This is a continuation of application Ser. No. 412,934, filed Nov. 5, 1973 now abandoned.

BACKGROUND OF THE INVENTION

1. Field of the Invention

This invention relates to electron beam resists for photomask fabrication and for semiconductor device fabrication.

2. Description of the Prior Art

The use of light as the irradiator for fabricating photoresists in the semiconductor art has been common for many years. The photoresist method of semiconductor manufacture was adequate until the advent of small geometry high frequency devices and integrated circuits requiring the formation of patterns with line widths in the neighborhood of one micron. Although one micron line opening, or resolution, can be obtained from photoresists in the laboratory, such line widths are not reproducible in production due to diffraction problems, with the practical limit of production produced openings being in the neighborhood of five to six microns in width.

The step from the use of light to electrons to form resists was a logical one. In the case of electron beam technology, an electron beam is scanned across the resist itself to form the desired pattern. The electron beam is controlled by a computer which has been fed the coordinates of the pattern as previously determined by a designer. Thus, the use of the electron beam has eliminated all the time lost in preparing the reduction photography required to form a patterned photoresist. However, due to the pattern in the electron beam resist resulting from the scan of a very narrow electron beam, the reaction time of the resist to the electron beam is the time drawback to the production use of electron beam resists.

Obviously, then, in addition to the characteristics required of a good photoresist, such as: good adhesion to many materials, good etch resistance to conventional etches, solubility in desired solvents, and thermostability, an electron resist must react to the electron beam irradiation fast enough to allow a reasonable scan time of the electron beam. In addition, in order to bring electron beam technology into production status, resists composed of thin polymer films that are capable of retaining an image of one micron or less at very high scanning speeds of the electron beam are required.

A number of approaches have been taken in the past to develop practical electron beam resists. The first approach and one that proved to be the least successful was the use of conventional photoresists, which are also polymers. Although capable of being exposed at relative high scan rates, such resists exhibit line widths, i.e., resolutions, greater than one micron in width.

The most widely used electron beam resist today is polymethyl methacrylate (PMMA), a positive resist; a positive resist being defined as a polymer that is insoluble in certain solvents but will degrade and become soluble when electron beam irradiates, a negative resist being a polymer that is soluble in certain solvents until irradiated. PMMA is characterized by excellent resolution and line width characteristics and by good processability. However, PMMA requires a relatively slow exposure rate, of approximately $5 \times 10^{-5}$ coulombs/cm$^2$, and has the inability to withstand strong oxidizing acids and base etches.

Theoretically, since the size of an electron is only about 1/1000th the size of a quantum of light, an electron beam should produce openings with line widths several orders of magnitude smaller than the size of openings obtained with photoresists. However, due to the electron back-scatter from the surface supporting the resist, such small width openings have not been obtained in the past, 0.7 microns being the practical lower limit in size. Because the back-scattering causes either degradation of the back-scattered area in the case of positive resists or causes cross linkage in the back-scattered area in the case of negative resists, the sides of the patterned openings in the resist, instead of being perpendicular to the support surface, tend to slope to a knife edge. The electrons bounce back through the resist at various angles between 90° and 180°, thus exposing the resist over a much larger cross sectional area than the diameter of the electron beam. An obvious solution to this problem of electron back-scatter is to use thinner films since the distance subtended by an angle increases with the distance from the origin. However, in most cases, this is not a practical solution because the resist must not be effected by the harsh etchants which are used to etch openings in the support; the thicker the resist, the greater the resistance of the resist to destruction by the etches. In addition, a thicker film is desirable for it will tend to cover any dust or other impurity particles on the support or in the resist itself, and will tend to cover pinholes in the resist thereby furnishing a much more uniform film.

Therefore, an object of this invention is to provide a method of forming an electron beam resist with better resolution and narrower width openings than is presently possible.

Another object of this invention is to provide a method of forming an electron beam resist that has all of the characteristics required of good electron beam resists, such as fast scanning speed, good adhesion to many materials, good processability and thermostability.

Another object of this invention is to provide a method of forming an electron beam resist that has openings with sides perpendicular to the support.

A further object of this invention is an electron beam resist having better resolution and narrower width openings than presently possible with current resists.

Yet another object of this invention is to provide an electron beam resist that has openings with sides perpendicular to the support.

Another object of this invention is to provide an electron beam resist that has all of the required characteristics required of good electron beam resists, such as fast scanning speed, good adhesion to many materials, good processability and thermostability.

SUMMARY OF THE INVENTION

Briefly, the invention involves the use of homopolymers or copolymers that undergo intensity or electron beam dose dependent reactions as electron beam resists, such a homopolymer being poly(methyl α-chloroacrylate) and such a copolymer being vinylchloride-vinylacetate. The polymer is applied as a liquid to a support and allowed to dry to a thin film. An electron beam is caused to sweep or scan across the surface of the polymer film in the desired pattern. In the case of the poly(methyl α-chloroacrylate), the portion of the polymer subjected to the direct beam of electrons receives sufficient energy to cause cross linking, thereby making the directly irradiated portion insoluble in certain solvents. The portion of the polymer directly irradiated acts as a negative resist. The portion of the polymer adjacent the directly irradiated portion of the polymer which is subjected to the back-scattered electrons does not receive sufficient energy to cross link, but instead begins to degrade and therefore acts as a positive resist. Of course, the portion of the polymer that is not subjected to either the direct electron beam or the back-scattered electrons is soluble in certain solvents, and can be dissolved and removed by the solvents along with the back-scattered electron portion of the polymer.

In the case of the vinylchloride-vinylacetate copolymer, both the directly irradiated portion of the polymer and the back-scattered portion act as negative resists. However, the directly irradiated portion receives sufficient energy from the electron beam to cross link and become insoluble in the solvent, whereas the portion of the polymer subjected to the back-scattered electrons does not receive sufficient energy to cross link and therefore, can be dissolved and removed by the solvent.

Therefore, through the use of an energy dependent polymer, better resolution and narrower width openings can be obtained than with conventional resists.

BRIEF DESCRIPTION OF THE DRAWINGS

The novel features believed characteristic of this invention are set forth in the appended claims. The invention itself, however, as well as other objects and advantages thereof, may best be understood by reference to the following detailed descriptions of two illustrative embodiments, when read in conjunction with the accompanying drawings, wherein:

DESCRIPTION OF THE INVENTION

In the case of the conventional negative electron beam resist, the portion of the polymer directly irradiated by the electron beam will cross link sufficiently to cause that portion of the polymer to be insoluble in certain solvents. However, the electrons, after they pass through the polymer and hit the surface of the polymer support, will bounce back or back-scatter through the polymer at various angles between 0° and 90°, thus, exposing the resist over a much larger cross-section than the initial beam diameter. The adjacent portion of the polymer that receives the back-scattered electrons, although not receiving as much energy as the directly irradiated portion, receives sufficient energy from the back-scattered electrons to cross link to a degree and thus the cross linked and insoluble portion of the polymer is much greater than is desired.

Figure 1:
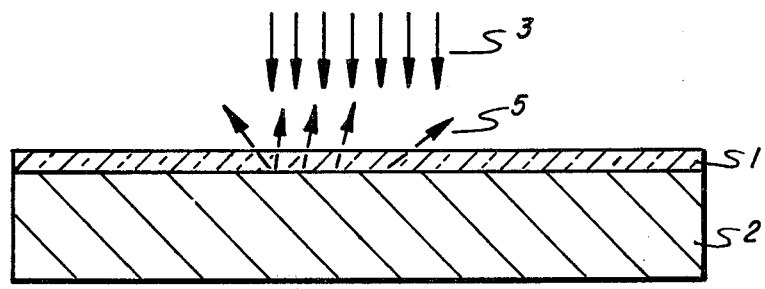
FIG. 1 is a cross-sectional view of a portion of an electron beam resist being irradiated by an electron beam.

Referring now to FIG. 1, there is shown a stylized cross-section of an electron beam resist 1 on a support 2 with an electron beam 3, represented by arrows, directed at the top surface 4 of the resist 1. The back-scattered electrons 5 are represented by the dotted arrows, which illustrates that a larger portion of the resist than just that portion subjected to the direct beam of electrons receives energy from the electrons.

Figure 2:
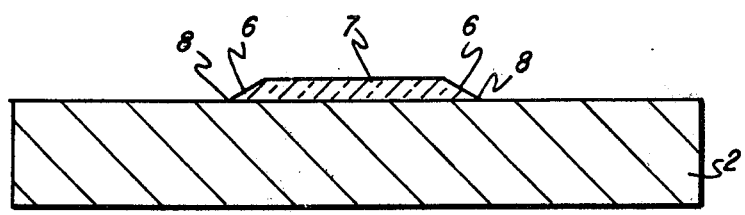
FIG. 2 is a cross-sectional view of a portion of a conventional patterned electron beam resist following irradiation and developing by a solvent.

In FIG. 2 is shown a portion of a conventional patterned negative electron beam resist after the unirradiated and uncross linked portion of the resist is removed by a solvent. The sloping sides 6 are clearly evident and the cross linked portion 7 of the polymer is larger than the diameter of the electron beam 3. The feather edges 8 will be destroyed by the etches used to etch the support 2, resulting in larger openings and less resolution of the support than desired.

In the preferred embodiment of the invention, poly(-methyl α-chloroacrylate)

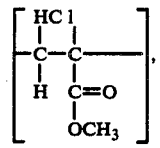

upon being subjected to a high energy source, such as an electron beam, for example (other sources being alpha particles and x-rays), acts as a negative resist in the directly irradiated portion of the polymer and as a positive resist in the back-scattered electron portion of the polymer. Upon receiving a high dosage of electrons from the electron beam, a whole series of reactive species are formed in the directly irradiated portion. For illustration, a reactive specie or reactive center results from the removal of the chloride (Cl) atom, for example, a reactive specie being represented by a dot:

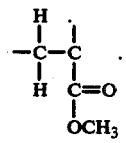

There will be enough of the reactive species in close proximity to each other so that they will react with each other. The reactive species react with each other and cross link with the cross linking causing the polymer to become insoluble and thus to act as a negative resist.

In the back-scattered electron region or portion, which has received a low electron beam dose as compared to the portion of the polymer subjected to the direct irradiation, due to fewer electrons, there are not very many reactive species produced and therefore, there are not many close to each other. Thus, the reactive species are still being generated but these reactive species have to have something to react with. In the low dosage region there are relatively few reactive species to react with each other and thus the reactive species will, figuratively speaking, "sit there" for awhile. Because, being in a solid, the mobility of the reactive species is severely limited and depending upon the particular polymer structure, the reactive species will do two things, i.e., they will "sit there" perpetually until some impurity migrates through, such as oxygen, and react with the reactive species or then can break down and "unzip." poly(methyl α-chloroacrylate) tends to break down. Therefore, in the low dosage region, because of the relatively few reactive species, the polymer tends to decompose and degrade, which reaction continues until the polymer chain breaks down so that the molecules are no longer a polymer but are small individual molecules.

Figure 3:
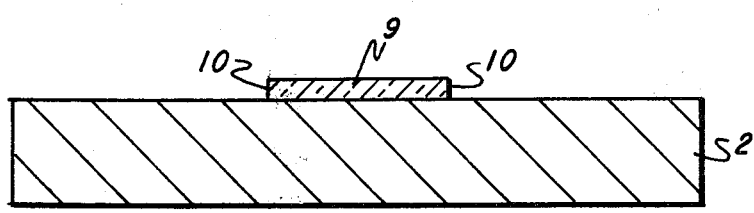
FIG. 3 is a cross-sectional view of a portion of a patterned electron beam resist fabricated according to this invention following irradiation and development by a solvent.

A patterned resist made from a dosage dependent polymer, such as poly(methyl α-chloroacrylate), is shown in FIG. 3. The portion of the resist 9 remaining after the removal of the soluble portion of the polymer has sides 10 perpendicular to the surface of the support. It should be noticed that the width of the top surface of the remaining polymer is essentially the width of the electron beam 3. Therefore, the resolution of the poly(methyl α-chloroacrylate) electron beam resist is much better and has much cleaner and narrower openings than can be achieved with conventional electron beam resists.

An alternate embodiment of the invention is the use of vinylchloride-vinylacetate copolymers

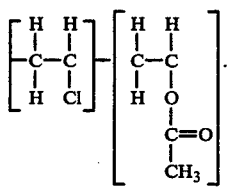

The principal of the invention is the same, being that the reactive species generated by the high energy dosage or the direct electron beam is different than the reactive species generated by the low energy dose or the back-scattered electrons. In the case of the vinylchloride-vinylacetate copolymer the resist acts only as a negative resist while a resist prepared from poly(methyl α-chloroacrylate) acts as a negative-positive resist.

When a thin film of vinylchloride-vinylacetate copolymer is subjected to an electron beam, the electron beam furnishes sufficient energy to break the hydrogen bonds of the vinylacetate

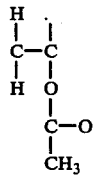

to form reactivated species which will react with each other and break the hydrogen and chloride bonds of the vinylchloride

with the removal of hydrogen chloride (HCl) to form a double bond. In the region of the high energy dosage (direct beam region and not the back-scattered electron region) there is a high concentration of both reactions so that there is a strong liklihood of the vinylchloride reacting with the vinylacetate. The electron beam therefore generates two reactive species which react with each other and start a chain reaction by reacting with the double bond. In the high dosage area both reactions will be going on simultaneously and there will be a high concentration of both groups so there is a great liklihood that the two groups will interreact. The electron beam has generated two species which react with each other and once they do react with each other, the chain reaction results because of the continued formation of the double bonds. In the region of the back-scattered electron or the low dosage region, both reactive species are still generated but the concentrations are much lower due to fewer electrons and thus less energy, so the liklihood of the reaction of the two reactive species happening is much less for there are fewer of them. As contrasted with polymers that only have one reactive species which generate no chain reaction, the chain reaction of the vinylchloride-vinylacetate copolymer causes a much greater degree of difference in the amount of cross linkage in the high dosage portion compared to the low dosage portion.

The process of forming a negative-positive electron beam resist from poly(methyl α-chloroacrylate) is described as follows: The poly(methyl α-chloroacrylate) is prepared as a solid and is mixed with an aromatic solvent, such as xylene or toluene, to form a 2% to 5% solution by weight, for example.

While a method of forming a patterned electron beam resist will be described in order to form a mask on a chromium plate or support for subsequent use as a photoetch mask to etch semiconductor wafers, the method of this invention is also used for direct application of the resist to the semiconductor wafer with the chrome etch being replaced by a semiconductor etch.

The polymer solution is applied to the support, such as chrome, and the support with the covering polymer, is spun at a speed of approximately 3000 rpm, for example, in order to form a uniform layer of polymer. The support with the covering layer of polymer is then baked in a nitrogen atmosphere at any temperature between 80° C. and 130° C. for approximately 30 minutes, for example, to remove all of the solvent, leaving a dried thin film of from 1000 A to 5000 A in thickness.

The substrate with the baked on polymer is then placed in an electron beam irradiator and the electron beam is allowed to scan the surface of the polymer in a predetermined pattern as controlled by a computer. To cause the poly(methyl α-chloroacrylate) to react as a negative-positive resist from the direct electron beam, a beam current of $\geq 5 \times 10^{-5}$ coulombs/cm$^2$ sec. must be maintained. When the poly(methyl α-chloroacrylate) is to be used only as a positive resist, a lower electron beam current of $<5 \times 10^{-5}$ coulombs/cm$^2$ sec. must be used. In order to form the same pattern of openings, the poly(methyl α-chloroacrylate), when used, as a positive resist must be scanned by a different electron beam pattern than the pattern required for a negative resist.

When the poly(methyl α-chloroacrylate) is used as a negative-positive resist, the portion of the resist subjected to the direct electron beam cross links and becomes insoluble in certain solvents, such as toluene or xylenes or ketone. The adjacent portion of the resist which is subjected to the back-scattered electrons will act as a positive resist, will degrade and is removed along with the unirradiated portion of the resist by the solvent. The polymer is developed by spraying or dipping the polymer covered support in the same aromatic or ketone solvent that was used at the beginning of this process for approximately 30 seconds which will be a sufficient length of time to dissolve and to remove the back-scattered portion and the unirradiated portion of the polymer leaving the desired pattern of openings in the resist. When it is desired that the poly(methyl α-chloroacrylate) act as a positive resist, the pattern is developed in a developer consisting of an aromatic solvent, such as isobutylmethyl ketone in a 30% mixture with alcohol. The 30% solvent-70% alcohol is not sacred but a wide range of solutions can be used with corresponding soak times to remove the irradiated portion of the resist. The unirradiated portion of the resist is affected by the solvent solution but to a lesser extent.

To remove the solvent and to harden the cross linked polymer pattern remaining on the support, the polymer covered support is baked at any temperature between 80° C. and 130° C. for 30 minutes in air, for example, which completes the polymer resist of this invention.

Resolution or line widths of <0.3 microns have been obtained by using poly(methyl α-chloroacrylate) as a negative-positive resist. The poly(methyl α-chloroacrylate) also acts as an excellent positive resist with good resolution, excellent adhesion, good processability and good thermostability when less energy is supplied.

Although not a part of this invention, the support with its finished resist is subjected to an etch for a period of time sufficient to remove the support exposed by the openings in the patterned electron beam resist. Finally, the resist is removed by dipping the polymer coated chrome support in dieytlphthalate-dioxane mixtures at >100° C. for 30 minutes. The patterned support is now ready to be used to form an image on a photoresist placed on a semiconductor wafer.

To form a patterned electron resist from vinylchloride-vinylacetate copolymer, such a copolymer, purchased commercially from Union Carbide by the trade name of VERR or VAGA is purchased as a solid and is mixed with an aromatic solvent, such as xylene or toluene, to form a 2% to 5% solution by weight, for example. The copolymer solution is applied to a support and the support with the covering copolymer is spun at an approximate speed of 3000 rpm, for example, in order to form a uniform layer of copolymer. The support with the covering layer of copolymer is then baked in a nitrogen atmosphere at any temperature between 80° C. and 130° C. for 15 minutes to remove all the solvent, leaving a dried thin film of from 1000 A to 5000 A in thickness.

The chrome substrate with the baked on copolymer is then placed in an electron beam irradiator and the electron beam is allowed to scan the surface of the copolymer in a predetermined pattern as controlled by a computer. The copolymer, being a negative resist, will cross link and the portion of the copolymer subjected to the electron beam, which portion will become insoluble in an aromatic or ketone solvent, will not be affected by the subsequent development with such a solvent. The back-scattered electron beam portion of the polymer will cross link to a much less degree and will be soluble in the solvent along with the unirradiated portion of the polymer. The copolymer is developed by spraying or dipping the copolymer covered support in an aromatic or ketone solvent for approximately 30 seconds, which will be a sufficient length of time to dissolve and remove the back-scattered electron beam portion and the unirradiated portions of the copolymer, leaving the desired pattern of openings in the resist. Resolution or the widths of $0.5\mu$ have been obtained by using vinylchloride-vinylacetate copolymer as a negative resist.

To harden the cross linked copolymer pattern remaining on the support, the copolymer covered support is baked at 100° C. in oxygen for 30 minutes, which completes the copolymer resist.

Although specific temperatures, times and solution percentages have been given, the particular numbers are not critical to the invention and can be varied within wide limits without affecting the finished product. Because openings with perpendicular walls can be obtained by the elimination of the back-scattered electron disadvantage, by this invention much narrower width openings can be obtained than with conventional resists. Both of the resist materials described have excellent adhesion to chrome, gold and silicon; excellent resistance to chrome, gold and silicon etches; are very soluble in the solvents given; and in all respects have excellent electron beam resist characteristics.

Although the energy source described has been an electron beam, any high energy irradiation such as x-rays and alpha particles can be used to cause the cross linkage and/or degradation involved, and although two specific embodiments of the invention have been described in detail, it is to be understood that various changes, substitutions and alterations can be made therein without departing from the spirit and the scope of the invention as defined by the appended claims.

What is claimed is:

1. The method of forming a patterned thin film of poly(methyl α-chloroacrylate) as a positive resist coating on a substrate surface, comprising the steps of:
    (a) applying a solution of poly(methyl α-chloroacrylate) to said support surface;
    (b) drying the applied solution to remove substantially all of the solvent, leaving a dried thin film of poly(methyl α-chloroacrylate) 1,000 to 5,000 angstroms thick;
    (c) selectively exposing the dried polymer film to an electron beam current of less than $5 \times 10^{-5}$ coulombs per $cm^2$ seconds, but sufficient to decompose the polymer in a predetermined pattern requiring resolutions on the order of 0.5 micron or less;
    (d) then developing the image by exposing the polymer pattern to a solvent which selectively removes only the exposed areas, while leaving the unexposed polymer film in the desired pattern.

2. The method as in claim 1 wherein the developer solvent is a mixture of isobutyl methyl ketone and alcohol.

3. A method as in claim 2 wherein the thin film polymer resist is applied to a silicon semiconductor wafer used in the fabrication of semiconductor devices.

* * * * *